(12) United States Patent
Xie et al.

(10) Patent No.: US 9,343,811 B2
(45) Date of Patent: May 17, 2016

(54) PHASE ADJUSTMENT APPARATUS AND MULTI-FREQUENCY ANTENNA

(71) Applicant: HUAWEI TECHNOLOGIES CO., LTD., Shenzhen (CN)

(72) Inventors: Shoubo Xie, Shenzhen (CN); Liming Zhao, Shenzhen (CN); Zhixiong Zhao, Shenzhen (CN); Maobin Li, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 295 days.

(21) Appl. No.: 14/052,920

(22) Filed: Oct. 14, 2013

(65) Prior Publication Data

US 2014/0043207 A1    Feb. 13, 2014

Related U.S. Application Data

(63) Continuation of application No. PCT/CN2011/072788, filed on Apr. 14, 2011.

(51) Int. Cl.
*H01Q 19/06* (2006.01)
*H01Q 3/00* (2006.01)
(Continued)

(52) U.S. Cl.
CPC ............. *H01Q 5/0024* (2013.01); *H01P 1/184* (2013.01); *H01Q 1/246* (2013.01); *H01Q 3/30* (2013.01); *H01Q 3/32* (2013.01); *H03H 1/00* (2013.01)

(58) Field of Classification Search
CPC ......... H03H 1/00; H01Q 5/0024; H01Q 3/32; H01Q 1/246; H01Q 3/30; H01P 1/184
See application file for complete search history.

(56) References Cited

U.S. PATENT DOCUMENTS

| 6,683,582 B1* | 1/2004 | Love ................. H01P 1/183 333/160 |
| 2005/0179610 A1 | 8/2005 | Le et al. ................. 343/797 |

(Continued)

FOREIGN PATENT DOCUMENTS

| CN | 101330168 | 12/2008 |
| CN | 101412439 | 4/2009 |

(Continued)

OTHER PUBLICATIONS

Extended European Search Report issued Mar. 27, 2014, in corresponding European Patent Application No. 11744284.8.

(Continued)

*Primary Examiner* — Trinh Dinh
(74) *Attorney, Agent, or Firm* — Staas & Halsey LLP

(57) ABSTRACT

The present invention discloses a phase adjustment apparatus. The phase adjustment apparatus includes at least two phase adjustment units, a switching apparatus, and a driving apparatus; where the at least two phase adjustment units are configured to modulate a phase; the driving apparatus is configured to drive the at least two phase adjustment units to move; the at least two phase adjustment units are selectively connected to the driving apparatus; and the switching apparatus is configured to select the at least two phase adjustment units, so that the driving apparatus drives, at a same moment, only one of the at least two phase adjustment units connected to the driving apparatus to move, so as to change a phase. The present invention discloses a multi-frequency antenna which applies the phase adjustment apparatus. The phase adjustment apparatus of the present invention may adjust a downtilt angle of an antenna unit.

14 Claims, 6 Drawing Sheets

(51) Int. Cl.
*H01Q 5/00* (2015.01)
*H01P 1/18* (2006.01)
*H01Q 3/30* (2006.01)
*H03H 1/00* (2006.01)
*H01Q 1/24* (2006.01)
*H01Q 3/32* (2006.01)

(56) References Cited

U.S. PATENT DOCUMENTS

2006/0066494 A1* 3/2006 Trejtnar ............... H01Q 3/32
  343/757
2011/0237315 A1* 9/2011 Seeor ................... H01Q 1/246
  455/575.7

FOREIGN PATENT DOCUMENTS

| CN | 101521312 | 9/2009 |
| WO | 2004/008568 A1 | 1/2004 |
| WO | 2009/102775 A2 | 8/2009 |

OTHER PUBLICATIONS

Chinese Office Action issued Dec. 24, 2012 in corresponding Chinese Patent Application No. 201180000364.4.

PCT International Search Report and Written Opinion of the International Searching Authority issued Jan. 19, 2012 in corresponding International Patent Application No. PCT/CN2011/072788.

* cited by examiner

US 9,343,811 B2

PHASE ADJUSTMENT APPARATUS AND MULTI-FREQUENCY ANTENNA

CROSS-REFERENCE TO RELATED APPLICATIONS

This application is a continuation of International Application No. PCT/CN2011/072788, filed on Apr. 14, 2011, which is hereby incorporated by reference in the entirety.

TECHNICAL FIELD

The present invention relates to the field of communications technologies, and in particular, to a phase adjustment apparatus and a multi-frequency antenna.

BACKGROUND

In the field of communications technologies, signals are received and sent by using an antenna. Generally speaking, the antenna has certain coverage, and during antenna installation, the coverage of the antenna itself needs to coincide with a range designed by people, so that the coverage of the antenna itself may be adjusted by adjusting a downtilt angle of the antenna. The so-called downtilt angle of the antenna is also called a pitch angle of the antenna, which is an included angle between the antenna and a horizontal direction.

In usual situation, adjustment of the downtilt angle of the antenna may be implemented through mechanical tilt and electrical tilt. The mechanical tilt is to physically tilt the antenna downwards. However, when the antenna is physically tilted downwards, construction and maintenance are inconvenient, and an adjusting precision of the downtilt angle is relatively low (for example, a step precision is approximately 1°). Therefore, in general situation, the electrical tilt may be adopted, a principle of the electrical tilt is to change amplitude values of a vertical component and a horizontal component by changing a dipole phase of a linear array antenna, so as to change a resultant strength, thereby enabling a vertical directivity pattern of the antenna to be tilted, achieving an objective that the antenna keeps still for adjusting the downtilt angle of the antenna.

When the downtilt angle of the antenna is adjusted by using the electrical tilt manner, the downtilt angle of a wave beam of the antenna may be adjusted by changing a phase of the antenna. For a multi-frequency antenna having at least two antenna units (the multi-frequency antenna may implement functions of at least two frequency bands, for example, one antenna unit implements a function of a 800 MHz frequency band, and the other antenna unit implements a function of a 3 G frequency band), the downtilt angle of each antenna unit may be modulated by individually modulating a phase of a phase adjustment unit corresponding to each antenna unit. Therefore, it is necessary to configure a transmission mechanism for each phase adjustment unit, where each transmission mechanism is connected to a driving apparatus (RCU, Remote Control Unit, remote control unit, also called a driving apparatus) in one-to-one correspondence. As shown in FIG. 1, a tri-frequency antenna is taken as an example for illustration, the tri-frequency antenna has three phase adjustment units 11 corresponding to antenna units 14, a transmission mechanism 12 is disposed for each phase adjustment unit 11, each transmission mechanism 12 is connected to a driving apparatus 13 in one-to-one correspondence, the driving apparatus 13 controls the corresponding transmission mechanism 12 to translate, and a phase of the corresponding phase adjustment unit 11 is modulated through the translation of the transmission mechanism 12, so as to implement modulating downtilt angles of the antenna units 14.

In a procedure of implementing the used process, the inventors find that the prior art at least has the following problems:

Because a driving apparatus is disposed for each corresponding phase adjustment unit, the more frequency bands included in a multi-frequency antenna are, the more the driving apparatuses to be used are, and cost of a single driving apparatus is relatively high, thereby inevitably resulting in rising of cost of the multi-frequency antenna.

SUMMARY

Embodiments of the present invention provide a phase adjustment apparatus and a multi-frequency antenna, so as to lower cost of the multi-frequency antenna.

In order to achieve the objective, embodiments of the present invention adopt the following technical solutions:

In an aspect, an embodiment of the present invention provides a phase adjustment apparatus, where the phase adjustment apparatus includes at least two phase adjustment units, a switching apparatus, and a driving apparatus; the at least two phase adjustment units are configured to modulate a phase; the driving apparatus is configured to drive the at least two phase adjustment units to move; the at least two phase adjustment units are selectively connected to the driving apparatus; and the switching apparatus is configured to select the at least two phase adjustment units, so that the driving apparatus drives, at a same moment, only one of the at least two phase adjustment units connected to the driving apparatus to move, so as to implement phase modulation.

In another aspect, an embodiment of the present invention further provides a multi-frequency antenna, where the multi-frequency antenna includes at least two antenna units, each of the antenna units is connected to a phase adjustment apparatus, the phase adjustment apparatus includes at least two phase adjustment units, a switching apparatus, and a driving apparatus, and the at least two antenna units are connected to the at least two phase adjustment units in one-to-one correspondence; the at least two phase adjustment units are configured to modulate a phase; the driving apparatus is configured to drive the at least two phase adjustment units to move; the at least two phase adjustment units are selectively connected to the driving apparatus; and the switching apparatus is configured to select the at least two phase adjustment units, so that the driving apparatus drives, at a same moment, only one of the at least two phase adjustment units connected to the driving apparatus to move, so as to implement phase modulation.

In further another aspect, an embodiment of the present invention further provides a phase adjustment apparatus, where the phase adjustment apparatus includes at least two phase adjustment units, a driving apparatus, and a switching apparatus; the driving apparatus is configured to drive the phase adjustment units to move to change a phase; the switching apparatus is disposed in a transmission link between the at least two phase adjustment units and the driving apparatus, so as to establish an effective transmission link between at least one phase adjustment unit in each of the phase adjustment units and the driving apparatus; and the driving apparatus drives, through the transmission link established by the switching apparatus, the phase adjustment unit in the effective transmission link to move.

In the phase adjustment apparatus and the multi-frequency antenna according to the embodiments of the present invention, the at least two phase adjustment units are selectively connected to the driving apparatus, and the switching apparatus is configured to select the at least two phase adjustment units, so that the driving apparatus drives, at the same moment, only one of the at least two phase adjustment units connected to the driving apparatus to move, so as to change the phase. In this way, phases of at least two corresponding phase adjustment units may be modulated using one driving apparatus, so as to implement modulating downtilt angles of the antenna units. It may be known that the number of used driving apparatuses may be reduced, thereby lowering the cost of the multi-frequency antenna.

DESCRIPTION OF EMBODIMENTS

A phase adjustment apparatus and a multi-frequency antenna according to embodiments of the present invention are described in detail with reference to the accompanying drawings.

It should be noted that the embodiments to be described are only a part rather than all of the embodiments of the present invention. All other embodiments obtained by persons of ordinary skill in the art based on the embodiments of the present invention without creative efforts shall fall within the protection scope of the present invention.

An embodiment of the present invention provides a phase adjustment apparatus. The phase adjustment apparatus includes at least two phase adjustment units, a switching apparatus, and a driving apparatus; where the at least two phase adjustment units are configured to modulate a phase; the driving apparatus is configured to drive the at least two phase adjustment units to move; the at least two phase adjustment units are selectively connected to the driving apparatus; and the switching apparatus is configured to select the at least two phase adjustment units, so that the driving apparatus drives, at a same moment, only one of the at least two phase adjustment units connected to the driving apparatus to move, so as to implement phase modulation.

In the phase adjustment apparatus according to this embodiment of the present invention, the at least two phase adjustment units are selectively connected to the driving apparatus, and the switching apparatus is configured to select the at least two phase adjustment units, so that the driving apparatus drives, at the same moment, only one of the at least two phase adjustment units connected to the driving apparatus to move, so as to change the phase. In this way, phases of at least two corresponding phase adjustment units may be modulated using one driving apparatus, so as to implement modulating downtilt angles of antenna units. It may be known that the number of used driving apparatuses may be reduced, thereby lowering the cost of a multi-frequency antenna.

In addition, because the number of the used driving apparatuses is reduced in the phase adjustment apparatus, that is, the number of the driving apparatuses is smaller than the number of the phase adjustment units (because the number of the phase adjustment units is the same as the number of frequency bands in the multi-frequency antenna, the number of the driving apparatuses is smaller than the number of the frequency bands in the multi-frequency antenna), a space occupied by the driving apparatus is relatively small, and a requirement on a installation space is relatively low. When the number of the used driving apparatuses is reduced, the number of installed driving apparatuses is also reduced, thereby reducing installation time of all the driving apparatuses.

The phase adjustment apparatus in the present invention is illustrated with reference to specific embodiments.

Figure 1:
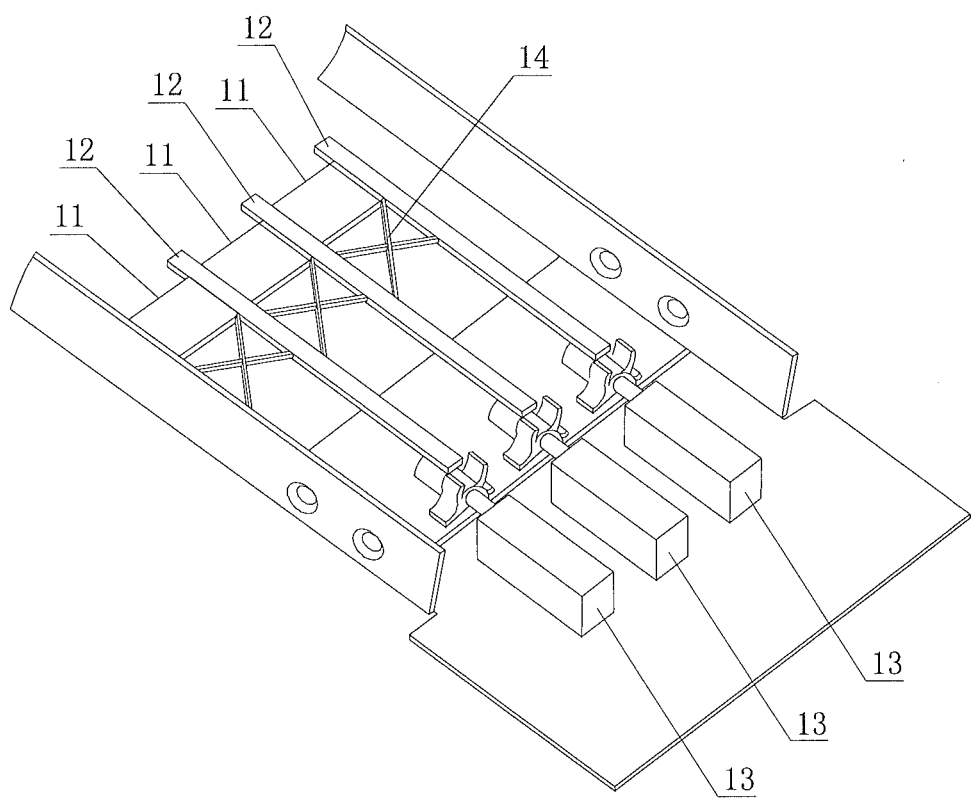
FIG. 1 is a schematic diagram of a multi-frequency antenna in prior art.
Figure 2:
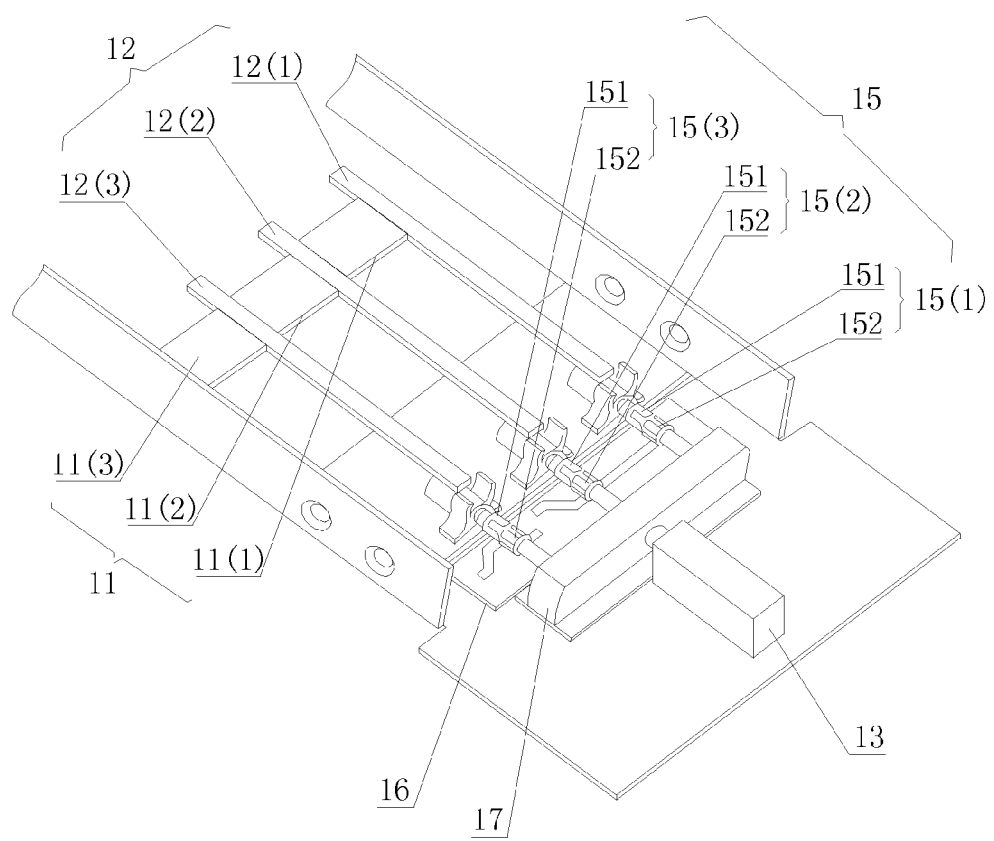
FIG. 2 is a schematic diagram of a phase adjustment apparatus according to an embodiment of the present invention.

As shown in FIG. 2, a specific embodiment of the phase adjustment apparatus according to the present invention is shown, which is configured to modulate a downtilt angle of each phase adjustment unit in a multi-frequency antenna. In this embodiment, the phase adjustment apparatus includes three phase adjustment units 11, a switching apparatus, and a driving apparatus 13. All of the three phase adjustment units 11 are connected to the switching apparatus, and are connected to the driving apparatus 13 through the switching apparatus, the switching apparatus enables the driving apparatus 13 to drive, at a same moment, only one of the three phase adjustment units 11 connected to the driving apparatus 13 to move. In order to enable the driving apparatus 13 to better drive one of the three connected phase adjustment units 11 to move, the phase adjustment apparatus further includes a transmission mechanism 12 corresponding to each of the phase adjustment units 11 to drive a phase adjustment unit to move, where the three phase adjustment units 11 connected to the driving apparatus 13 are connected to the switching apparatus through corresponding transmission mechanisms 12.

For example, the phase adjustment apparatus includes three phase adjustment units 11 and three transmission mechanisms 12, namely, a first phase adjustment unit 11(1), a second phase adjustment unit 11(2), and a third phase adjustment unit 11(3), and a first transmission mechanism 12(1) corresponding to the first phase adjustment unit 11(1), a second transmission mechanism 12(2) corresponding to the second phase adjustment unit 11(2), and a third transmission mechanism 12(3) corresponding to the third phase adjustment unit 11(3), where the three transmission mechanisms 12 are connected to the same driving apparatus 13 through the switching apparatus.

It should be illustrated here that in the embodiment shown in FIG. 2, the phase adjustment apparatus applied in a tri-frequency antenna having three frequency bands is taken as an example for illustration, but in other embodiments of the present invention, the multi-frequency antenna may include at least two phase adjustment units, for example, two, four, or more than four phase adjustment units, but is not limited to three phase adjustment units. In addition, for each transmission mechanism corresponding to the phase adjustment units, these transmission mechanisms may be connected to the same driving apparatus through the switching apparatus, and at least two of the transmission mechanisms may also be connected to the same driving apparatus through the switching apparatus, where the switching apparatus enables the driving apparatus to link with only one of the at least two transmission mechanisms at a time, thereby implementing controlling, by using one driving apparatus, the at least two transmission mechanisms to translate, so as to implement modulating the phases of the at least two phase adjustment units by using one driving apparatus, thereby reducing the number of used driving apparatuses.

In each embodiment of the present invention, the switching apparatus, capable of enabling the driving apparatus 13 to link with only one of the at least two transmission mechanisms 12 at a time, has multiple implementation structures. Now, several specific structures of the switching apparatus are introduced in an exemplary manner. It should be noted that the introduction in the following is only exemplary instead of being limitative, and any modifications or variations made according to the solutions illustrated in the following fall within the protection scope of the embodiments of the present invention.

For example, in the embodiment of the phase adjustment apparatus shown in FIG. 2, a clutch 15 that corresponds to each of the transmission mechanisms 12 connected to the switching apparatus may be disposed in the switching apparatus, that is, a first clutch 15(1) corresponding to the first transmission mechanism 12(1) is disposed, a second clutch 15(2) corresponding to the second transmission mechanism 12(2) is disposed, and a third clutch 15(3) corresponding to the third transmission mechanism 12(3) is disposed. Each clutch 15 includes a driven part 151 and a driving part 152 capable of being separated from or engaged with each other, and a switching part 16. The driven parts 151 of the clutches 15 are connected to the transmission mechanisms 12 in one-to-one correspondence, the driving parts 152 are connected to the driving apparatus 13 and correspond to the driven parts 151 in one-to-one correspondence, a driving part 152 is further connected to a switching part 16, and the switching part 16 controls the driving part 152 of one of the clutches 15 to be connected to the corresponding driven part 151, and the driving parts 152 of the remaining clutches to be separated from the driven parts 151 of the remaining clutches.

Figure 3:
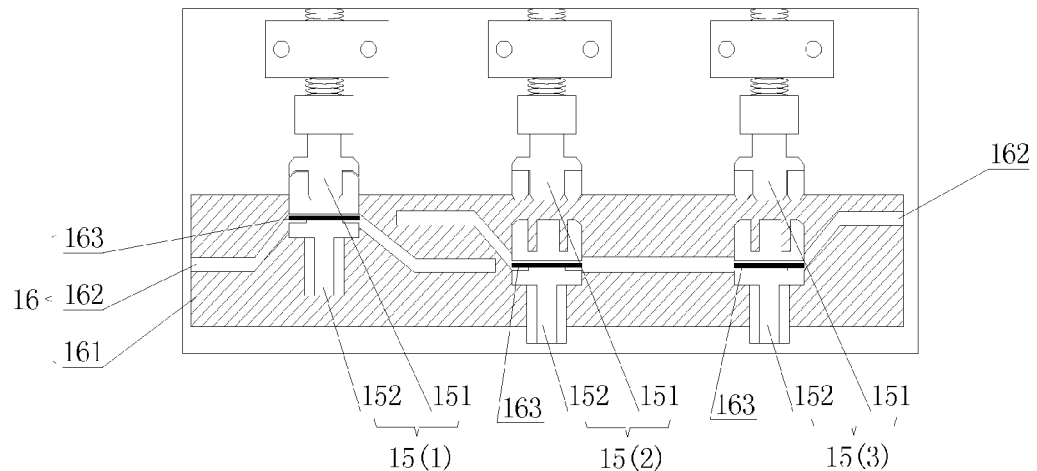
FIG. 3 is a schematic diagram of a switching apparatus in the phase adjustment apparatus shown in FIG. 2.

As shown in FIG. 3, when the driving part 152 of the first clutch 15(1) is connected to the driven part 151 of the first clutch 15(1), and the driving parts 152 of the second clutch 15(2) and the third clutch 15(3) are separated from the driven parts 151 of the second clutch 15(2) and the third clutch 15(3), the first transmission mechanism 12(1) links with the driving apparatus 13, a motor of the driving apparatus 13 drives the first transmission mechanism 12(1) to translate, and a phase of the first phase adjustment unit is modulated through the translation of the first transmission mechanism 12 (1), so as to implement modulating the downtilt angle of the antenna. In this situation, because the second transmission mechanism 12(2) and the third transmission mechanism 12(3) do not link with the driving apparatus 13, the second transmission mechanism 12(2) and the third transmission mechanism 12(3) do not translate.

Figure 4:
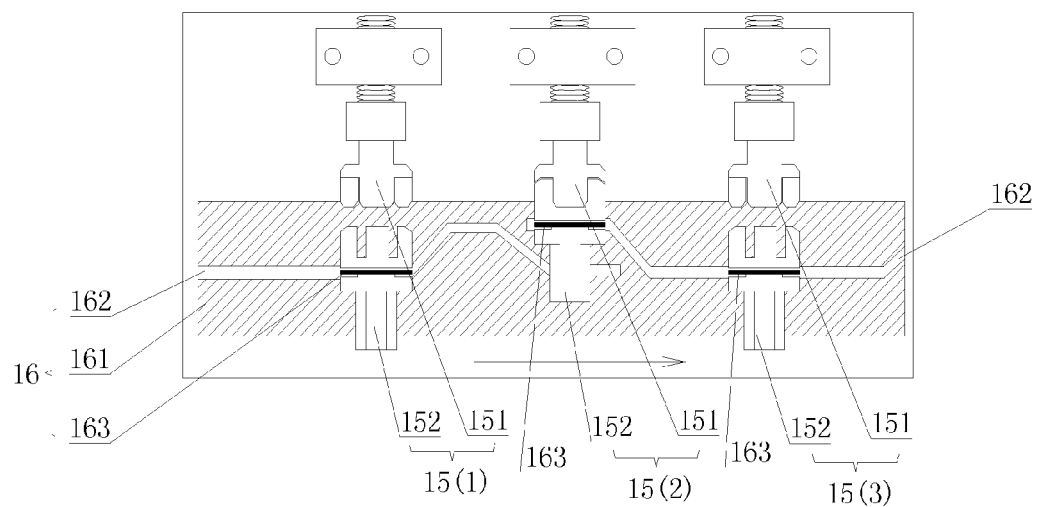
FIG. 4 is another schematic diagram of the switching apparatus in the phase adjustment apparatus shown in FIG. 2.

As shown in FIG. 4, when the driving part 152 of the second clutch 15(2) is connected to the driven part 151 of the second clutch 15(2), and the driving parts 152 of the first clutch 15(1) and the third clutch 15(3) are separated from the driven parts 151 of the first clutch 15(1) and the third clutch 15(3), the second transmission mechanism 12(2) links with the driving apparatus 13, a motor of the driving apparatus 13 drives the second transmission mechanism 12(2) to translate, and a phase of the second phase adjustment unit is modulated through the translation of the second transmission mechanism 12(2), so as to implement modulating the downtilt angle of the antenna. In this situation, because the first transmission mechanism 12(1) and the third transmission mechanism 12(3) do not link with the driving apparatus 13, the first transmission mechanism 12(1) and the third transmission mechanism 12(3) do not translate.

Figure 5:
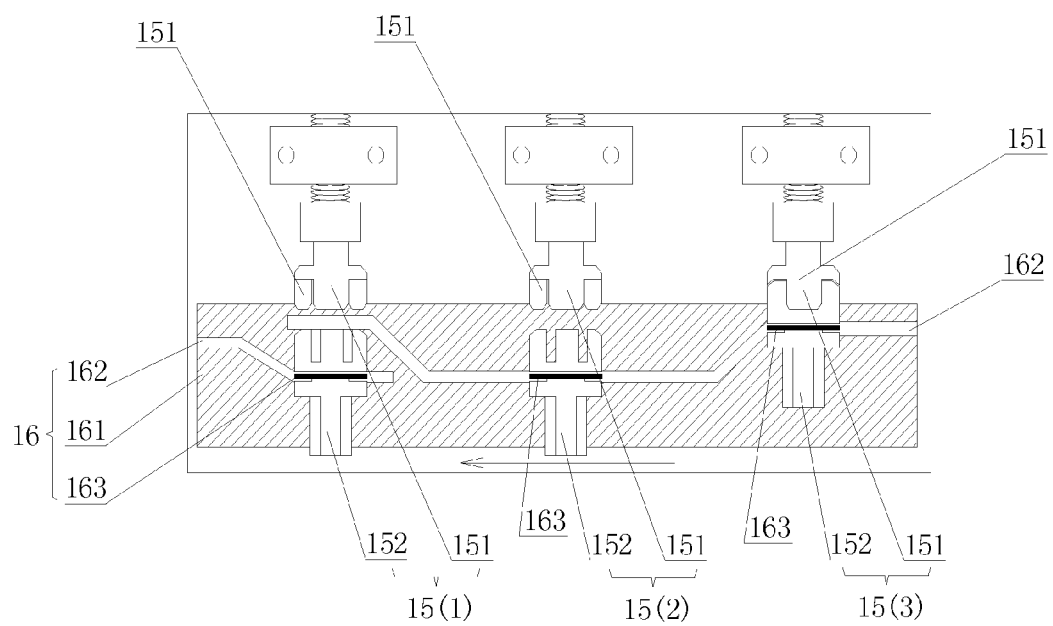
FIG. 5 is further another schematic diagram of the switching apparatus in the phase adjustment apparatus shown in FIG. 2.

As shown in FIG. 5, when the driving part 152 of the third clutch 15(3) is connected to the driven part 151 of the third clutch 15(3), and the driving parts 152 of the first clutch 15(1) and the second clutch 15(2) are separated from the driven parts 151 of the first clutch 15(1) and the second clutch 15(2), the third transmission mechanism 12(3) links with the driving apparatus 13, a motor of the driving apparatus 13 drives the third transmission mechanism 12(3) to translate, and a phase of the third phase adjustment unit is modulated through the translation of the third transmission mechanism 12(3), so as to implement modulating the downtilt angle of the antenna. In this situation, because the first transmission mechanism 12(1) and the second transmission mechanism 12(2) do not link with the driving apparatus 13, the first transmission mechanism 12(1) and the second transmission mechanism 12(2) do not translate.

States of being connected or separated of the driving parts 152 and the driven parts 151 of the first clutch 15(1), the second clutch 15(2), and the third clutch 15(3) may be implemented through the switching parts 16.

A switching part 16 may control the driving part 152 of one of the clutches 15 to be connected to the driven part 151, and the driving parts 152 of the remaining clutches to be separated from the driven parts 151 of the remaining clutches.

For example, referring to schematic diagrams of the switching apparatus shown in FIG. 3 and FIG. 5, it may be known that a switching part 16 in the switching apparatus may include a sliding plate 161, a cascade guide rail 162 is disposed on the sliding plate 161, a sleeve ring 163 is sleeved on the driving part 152 of each clutch 15, the sleeve ring 163 penetrates the guide rail 162, and the sliding plate 161 slides to enable the driving part 152 of each clutch 15 to be engaged with or separated from the corresponding driven part 151.

In other embodiments of the present invention, the guide rail 162 may be not limited to the cascade guide rail, and may be a zigzag guide rail, and the zigzag guide rail may implement that when the sliding plate 161 slides, the driving part 152 of each clutch 15 are enabled to be engaged with or separated from the corresponding driven part 151. In the following, an example is given for illustrating that the sliding plate 161 is enabled to slide, so that the driving part 152 of each clutch 15 is enabled to be engaged with or separated from the corresponding driven part 151.

For example, when the sliding plate 161 moves along a longitudinal direction of the guide rail 162, a side wall of the guide rail 162 forces the sleeve ring 163 to drive the driving part 152 to move along a direction being vertical to the longitudinal direction of the guide rail 162, so as to enable the driving part 152 of each clutch 15 to be engaged with or separated from the driven part 151. Now, the procedure in which under movement of the sliding plate 161, the driving part 152 and driven part 151 of each clutch 15 are connected to or separated from each other is described in detail.

Under the state shown in FIG. 3, the driving part 152 of the first clutch 15(1) is connected to the driven part 151 of the first clutch 15(1), and the driving parts of the second clutch 15(2) and the third clutch 15(3) are separated from the driving parts 152 of the second clutch 15(2) and the third clutch 15(3). In this situation, the state shown in FIG. 3 is an initial state, the sliding plate 161 may move to the right, that is, as shown by the right arrow in FIG. 4, the sliding plate 161 moves to the right along the longitudinal direction of the guide rail 162, and the state after the movement is shown in FIG. 4. When the sliding plate 161 moves to the right, the guide rail 162 in the sliding plate 161 also moves to the right accordingly. Because the guide rail 162 is a cascade guide rail (that is, in the direction being vertical to the longitudinal direction of the guide rail 162, a distance from the guide rail 162 to the driven part 152 of each clutch 15 is great or small at different positions), when the guide rail 162 moves to the right along the longitudinal direction, the sleeve ring 163 on the first clutch 15(1) slides from a bump of the guide rail 162 on a left side of the sliding plate 161 to a recess, the sleeve ring 163 on the second clutch 15(2) slides from a recess of the guide rail 162 on a right side of the sliding plate 161 to a bump, and the sleeve ring 163 on the third clutch 15(3) slides along the guide rail 162 on the right side of the sliding plate 161 without fluctuation, so that each clutch 15 moves only in the direction being vertical to the longitudinal direction of the guide rail 162, that is, in a procedure in which the state shown in FIG. 3 is changed to the state shown in FIG. 4, the driving part 152 of the first clutch 15(1) sides downwards, the driving part 152 of the second clutch 15(2) sides upwards, and the driving part 152 of the third clutch 15(3) keeps still. In this way, under the state shown in FIG. 4, the driving part 152 of the second clutch 15(2) is connected to the driven part 151 of the second clutch 15(2), and the driving parts 152 of the first clutch 15(1) and the third clutch 15(3) are separated from the driven parts 151 of the first clutch 15(1) and the third clutch 15(3).

Alternatively, with the state shown in FIG. 3 being the initial state, the sliding plate 161 may also move to the left, that is, as shown by the left arrow in FIG. 5, the sliding plate 161 moves to the left along the longitudinal direction of the guide rail 162, and the state after the movement is shown in FIG. 5. When the sliding plate 161 moves to the left, the guide rail 162 in the sliding plate 161 also moves to the left accordingly. Because the guide rail 162 is a cascade guide rail, when the guide rail 162 moves to the left along the longitudinal direction, the sleeve ring 163 on the first clutch 15(1) slides from a bump of the guide rail 162 on a left side of the sliding plate 161 to a recess, the sleeve ring 163 on the third clutch 15(3) slides from a recess of the guide rail 162 on a right side of the sliding plate 161 to a bump, and the sleeve ring 163 on the second clutch 15(2) slides along the guide rail 162 on the right side of the sliding plate 161 without fluctuation, so that each clutch 15 moves only in the direction being vertical to the longitudinal direction of the guide rail 162, that is, in a procedure in which the state shown in FIG. 3 is changed to the state shown in FIG. 5, the driving part 152 of the first clutch 15(1) sides downwards, the driving part 152 of the third clutch 15(3) sides upwards, and the driving part 152 of the second clutch 15(2) keeps still. In this way, under the state shown in FIG. 5, the driving part 152 of the third clutch 15(3) is connected to the driven part 151 of the third clutch 15(3), and the driving parts 152 of the first clutch 15(1) and the second clutch 15(2) are separated from the driven parts 151 of the first clutch 15(1) and the second clutch 15(2).

It may be known from the above illustration that under the movement of the sliding plate 161, the driving part 152 and driven part 151 of each clutch 15 may be connected to or separated from each other.

It should be illustrated that referring to FIG. 2 again, after one clutch in each of the clutches 15 is connected and the remaining clutches are separated by using the sliding plate 161, the guide rail 162, and the sleeve ring 163, the movement of the motor of the driving apparatus 13 may be delivered to the connected clutch 15 by using some commonly used mechanisms 17, for example, the commonly used mechanisms may be a gear mechanism, a belt pulley mechanism, a chain pulley mechanism, a crank block mechanism, and the like.

Generally, gaps may exist between an inner diameter of the sleeve ring 163 and an outer diameter of the driving part 152 of each clutch 15. Referring to FIG. 3 to FIG. 5 again, it may be known that the sleeve ring 163 may drive each driving part 152 to slide downwards and upwards in the direction being vertical to the guide rail 162, and because of the existence of the gaps, the sleeve ring 163 may not affect the rotating of each clutch 15 with a connected rotation shaft. In addition, for the purpose of enabling the sleeve ring 163 to slide from the pump of the guide rail 162 to the recess or from the recess of the guide rail 162 to the bump, an included angle between the bump of the guide rail 162 and the recess of the guide rail 162 is made to form an obtuse angle, and an chamfer or a blending may be further disposed at the obtuse angle.

Under a usual situation, when two or three clutches 15 correspond to one sliding plate 161, a guide rail may be disposed on the sliding plate 161, and through the cascade shape of the guide rail, one of the two or three clutches 15 is connected, and other clutches are separated. When more clutches 15 correspond to one sliding plate 161 and only one guide rail is disposed on the sliding plate 161 to ensure one clutch in each of the clutches to be connected and the remaining clutches to be separated, the cascade shape of the guide rail may be relatively complicated. In this case, two or more guide rails may be disposed on the sliding plate 161, so that a shape of each guide rail may be relatively simple and is convenient to manufacture.

In addition to the above switching parts 16, a switching part of another form may also be applied. For example, the switching parts 16 in the switching apparatus may further include driving members connected to the driving parts 152 of each clutches 15 in one-to-one correspondence, each of the driving members is connected to a controller, and the controller controls the motor to drive the driving part to be engaged with or separated from the corresponding driven part. The controller may send a level signal to each driving member send, and after receiving a high level signal, a driving member is started. The started driving member drives, through a transmission mechanism (the transmission mechanism is configured to transfer the movement and a dynamic force of the driving member to an active member 152 of a clutch, and is different from the transmission mechanism 12), the driving part 152 of the corresponding clutch 15 to move up and down, so as to enable one clutch in each of the clutches to be connected, and the remaining clutches to be separated. The driving member may be but is not limited to the motor.

In addition to the described structure of the switching apparatus, the switching apparatus may further have other implementation structures, for example, the switching apparatus may further include a driving wheel, at least two driven wheels, and a wheel selector; where in manner one, the driving wheel may be connected to the driving apparatus, the at least two driven wheels may be connected to the corresponding transmission mechanisms through the wheel selector, the wheel selector selects one of the at least two driven wheels to form a transmission link with the driving wheel, so as to drive the corresponding transmission mechanism to move; or in manner two, the driving wheel may be connected to the driving apparatus through the wheel selector, the at least two driven wheels are connected to the corresponding transmission mechanisms, the wheel selector selects one of the at least two driven wheels to form a transmission link with the driving wheel, so as to drive the corresponding transmission mechanism to move.

It is illustrated in the following how to select, by the wheel selector, one of the at least two driven wheels to form the transmission link with the driving wheel in the manner two. It should be understood that in the manner one, the procedure of selecting, by the wheel selector, one of the at least two driven wheels to form the transmission link with the driving wheel is similar to the manner two, and the procedure of the manner one may be determined according to the description of the manner two.

Figure 6:
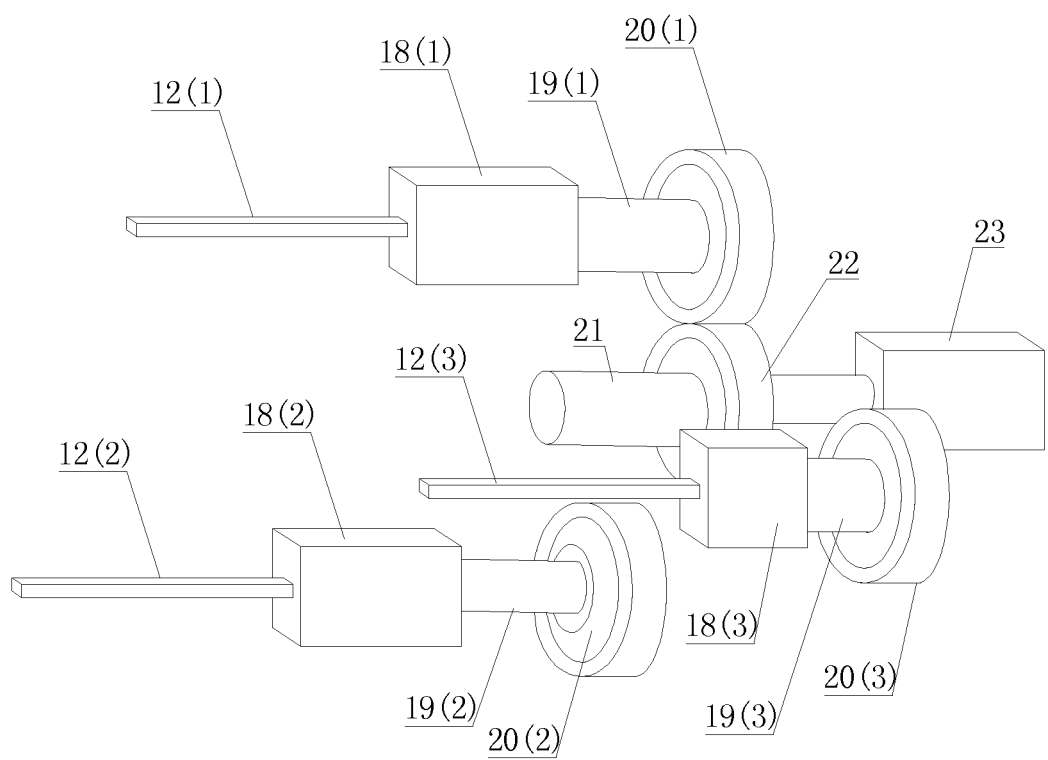
FIG. 6 is still another schematic diagram of the switching apparatus in the phase adjustment apparatus shown in FIG. 2.

As shown in FIG. 6, in another embodiment of the present invention, the switching apparatus includes a driving wheel 22, three driven wheels 20, and a wheel selector 23. Each of the transmission mechanisms 12 is connected to a driven wheel 20 through a driven shaft 19, respectively being that: the first transmission mechanism 12(1) is connected to a first driven wheel 20(1) through a first driven shaft 19(1), the second transmission mechanism 12(2) is connected to a second driven wheel 20(2) through a second driven shaft 19(2), and the third transmission mechanism 12(3) is connected to a third driven wheel (3) through a third driven shaft 19(3). Each driven shaft 19 is disposed in parallel in space, and each driven wheel 20 is distributed on different positions along a longitudinal direction of each driven shaft 19, for example, under the state shown in FIG. 6, a position of the first driven wheel 20(1) is located in the middle, a position of the second driven wheel 20(2) is located on a front part, and a disposed position of the third driven wheel 20(3) is located on a back part. A driving shaft 21 is disposed in parallel with each driven shaft 19, a driving wheel 22 is disposed on the driving shaft 21, the driving wheel 22 is further connected to a wheel selector 23, and the wheel selector 23 selects one of the three driven wheels 20 to form a transmission link with the driving wheel 22, so as to drive the corresponding transmission mechanism 12 to move.

It should be illustrated that when movement of each of the transmission mechanisms 12 is translation, and movement of each driven wheel is rotation, a converting member 18 may be disposed on each driven shaft 19, so as to convert the rotation of the driven wheels 20 to translation, and then deliver the translation to each of the transmission mechanisms 12, where the converting members 18 include: a first converting member 18(1) disposed on the first driven shaft 19(1), a second converting member 18(2) disposed on the second driven shaft 19(2), and the third converting member 18(3) disposed on the third driven shaft 19(3).

When the driving wheel 22 is engaged with the first driven wheel 20(1), and is separated from the second driven wheel 20(2) and the third driven wheel 20(3), after the driving shaft 21 is connected to the driving apparatus 13, the first transmission mechanism 12(1) links with the driving apparatus 13, the motor of the driving apparatus 13 drives the first transmission mechanism 12(1) to translate, and a phase of the first phase adjustment unit is modulated through the translation of the first transmission mechanism 12(1), so as to implement modulating a downtilt angle of the antenna. In this situation, because the second transmission mechanism 12(2) and the third transmission mechanism 12(3) do not link with the driving apparatus 13, the second transmission mechanism 12(2) and the third transmission mechanism 12(3) do not translate.

When the driving wheel 22 is engaged with the second driven wheel 20(2), and is separated from the first driven wheel 20(1) and the third driven wheel 20(3), after the driving shaft 21 is connected to the driving apparatus 13, the second driven wheel 20(2) links with the driving apparatus 13, the motor of the driving apparatus 13 drives the second driven wheel 20(2) to translate, and a phase of the second phase adjustment unit is modulated through the translation of the second transmission mechanism 12(2), so as to implement modulating a downtilt angle of the antenna. In this situation, because the first transmission mechanism 12(1) and the third transmission mechanism 12(3) do not link with the driving apparatus 13, the first transmission mechanism 12(1) and the third transmission mechanism 12(3) do not translate.

When the driving wheel 22 is engaged with the third driven wheel 20(3), and is separated from the first driven wheel 20(1) and the second driven wheel 20(2), after the driving shaft 21 is connected to the driving apparatus 13, the third driven wheel 20(3) links with the driving apparatus 13, the motor of the driving apparatus 13 drives the third driven wheel 20(3) to translate, and a phase of the third phase adjustment unit is modulated through the translation of the third transmission mechanism 12(3), so as to implement modulating a downtilt angle of the antenna. In this situation, because the first transmission mechanism 12(1) and the second transmission mechanism 12(2) do not link with the driving apparatus 13, the first transmission mechanism 12(1) and the second transmission mechanism 12(2) do not translate.

In the following, an example is given for illustrating how to select, by the wheel selector 23, one of the three driven wheels 20 to form the transmission link with the driving wheel 22, so as to drive the corresponding transmission mechanism 12 to move. It should be noted that the introduction in the following is only exemplary instead of being limitative.

Under the state shown in FIG. 6, the driving wheel 22 is engaged with the first driven wheel 20(1), and is separated from the second driven wheel 20(2) and the third driven wheel 20(3). With the state shown in FIG. 6 being the initial state, the wheel selector 23 may drive the driving shaft 21 together with the driving wheel 22 to move to the front along the longitudinal direction of the driving shaft 21, so that the driving wheel 22 is disengaged from the first driven wheel 20(1) and engaged with the second driven wheel 20(2). Alternatively, with the state shown in FIG. 6 being the initial state, the wheel selector 23 may further drive the driving shaft 21 together with the driving wheel 22 to move to the back along the longitudinal direction of the driving shaft 21, so that the driving wheel 22 is disengaged from the first driven wheel 20(1) and engaged with the third driven wheel 20(3).

Usually, sizes of the first driven wheel 20(1), the second driven wheel 20(2), and the third driven wheel 20(3) may be the same, so that the motion and dynamic force delivered from each driven wheel are the same. Definitely, the present invention is not limited hereto, in other embodiments of the present invention, the sizes of the first driven wheel 20(1), the second driven wheel 20(2), and the third driven wheel 20(3) may be different from one another or different individually. In addition, the size of the driving wheel 22 may be the same or different from the size of each driven wheel, which depends on specific situations.

It should be understood that the driving wheel or the driven wheel in this embodiment of the present invention may be a gear. However, the present invention is not limited thereto, and the above technical solution may be implemented through belt transmission, link transmission, and other manners.

Figure 7:
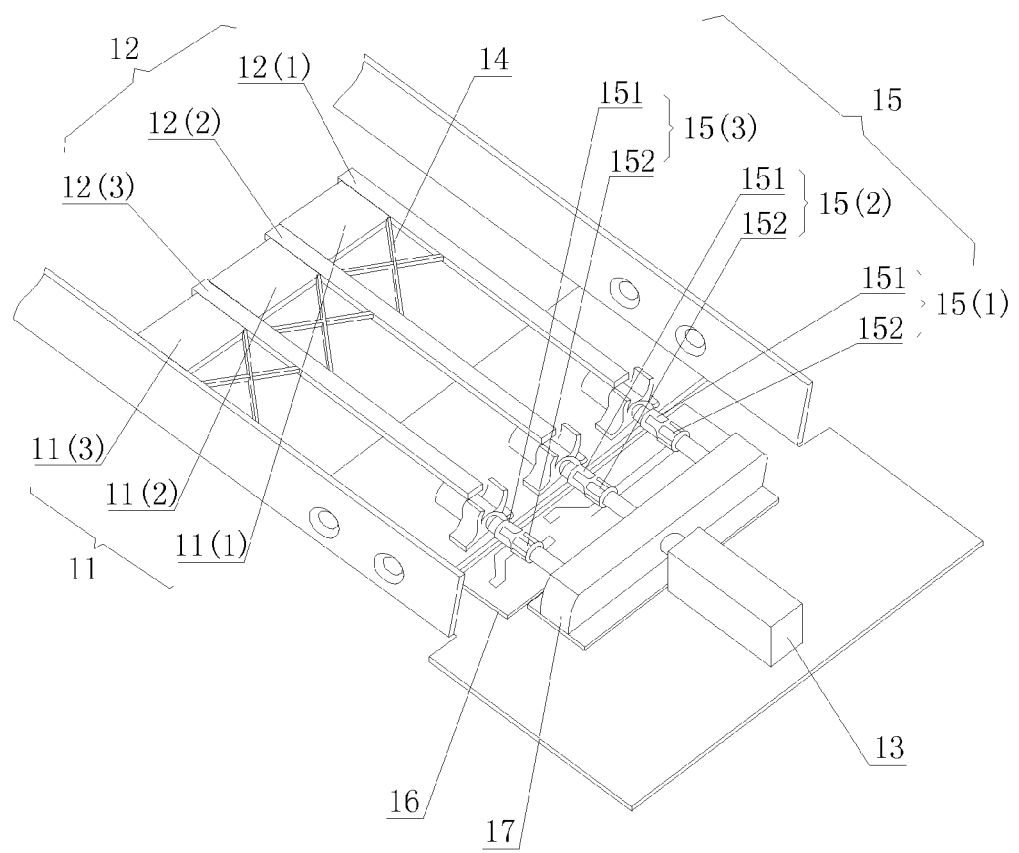
FIG. 7 is a schematic diagram of a multi-frequency antenna according to an embodiment of the present invention.

In addition to the above embodiment, the present invention further provides an embodiment of a multi-frequency antenna. As shown in FIG. 7, the multi-frequency antenna includes three antenna units 14, each antenna unit 14 is connected to a phase adjustment apparatus, the phase adjustment apparatus includes three phase adjustment units 11, a switching apparatus, and a driving apparatus 13, and the three antenna units 14 are connected to the three phase adjustment units 11 in one-to-one correspondence. All of the three phase adjustment units 11 are connected to the switching apparatus, and are connected to the driving apparatus 13 through the switching apparatus, the switching apparatus enables the driving apparatus 13 to drive, at a same moment, only one of the three phase adjustment units 11 connected to the driving apparatus 13 to move.

In the multi-frequency antenna according to this embodiment, the at least two phase adjustment units are selectively connected to the driving apparatus, and the switching apparatus is configured to select the at least two phase adjustment units, so that the driving apparatus drives, at the same moment, only one of the at least two phase adjustment units connected to the driving apparatus to move, so as to change a phase. In this way, phases of at least two corresponding phase adjustment units may be modulated using one driving apparatus, so as to implement modulating downtilt angles of the antenna units. It may be known that the number of used driving apparatuses may be reduced, thereby lowering the cost of the multi-frequency antenna.

It should be illustrated that the phase adjustment apparatus in this embodiment of the multi-frequency antenna and the phase adjustment apparatus in the above embodiment are the same in the structure and the functions, and therefore the same technical problems can be solved and the same anticipated effect can be achieved. For the specific description of the phase adjustment apparatus, reference may be made to the above embodiment.

In addition, an embodiment of the present invention further provides a phase adjustment apparatus. The phase adjustment apparatus includes at least two phase adjustment units, a driving apparatus, and a switching apparatus; where the driving apparatus is configured to drive the phase adjustment units to move to change a phase; the switching apparatus is disposed in a transmission link between the at least two phase adjustment units and the driving apparatus, so as to establish an effective transmission link between at least one phase adjustment unit in each of the phase adjustment units and the driving apparatus; and the driving apparatus drives, through the transmission link established by the switching apparatus, the phase adjustment unit in the effective transmission link to move.

In order to enable the driving apparatus to better drive one of the at least two connected phase adjustment units to move, the phase adjustment apparatus further includes a transmission mechanism corresponding to each of the phase adjustment units to drive a phase adjustment unit to move, where the transmission mechanism is disposed in the transmission link between the at least two phase adjustment units and the driving apparatus, so as to connect the at least two phase adjustment units to the driving apparatus through the switching apparatus.

For the switching apparatus, a clutch that corresponds to each of the transmission mechanisms connected to the switching apparatus is disposed in the switching apparatus, each clutch includes a driven part and a driving part capable of being separated from or engaged with each other, and a switching part; the driven part of the clutch is connected to the transmission mechanism in one-to-one correspondence, the driving part is connected to the driving apparatus and corresponds to the driven part in one-to-one correspondence, the driving part is further connected to the switching part, and the switching part controls the driving part of one clutch in each of the clutches to be connected to the corresponding driven part, and the driving parts of the remaining clutches to be separated from the driven parts of the remaining clutches.

Alternatively, the switching apparatus includes a driving wheel, at least two driven wheels, and a wheel selector; where the driving wheel may be connected to the driving apparatus, the at least two driven wheels may be connected to the corresponding transmission mechanism through the wheel selector, and the wheel selector selects one of the at least two driven wheels to form a transmission link with the driving wheel, so as to drive the corresponding transmission mechanism to move; or the driving wheel may be connected to the driving apparatus through the wheel selector, the at least two driven wheels may be connected to the corresponding transmission mechanism, and the wheel selector selects one of the at least two driven wheels to form a transmission link with the driving wheel, so as to drive the corresponding transmission mechanism to move.

The foregoing descriptions are merely several embodiments of the present invention, but not intended to limit the present invention. Various variations and modifications made by persons skilled in the art without departing from the spirit of the present invention fall within the scope of the present invention. Therefore, the protection scope of the present invention is subject to the appended claims.

What is claimed is:

1. A phase adjustment apparatus, comprising:
   at least two phase adjustment units,
   a switching apparatus, and
   a driving apparatus; wherein the at least two phase adjustment units are configured to modulate a phase of an electrical signal;
   the driving apparatus is configured to drive the at least two phase adjustment units to move;
   the at least two phase adjustment units are selectively connected to the driving apparatus; and
   the switching apparatus is configured to select the at least two phase adjustment units, so that the driving apparatus drives, at a same moment, only one of the at least two phase adjustment units connected to the driving apparatus to move, so as to implement phase modulation.

2. The phase adjustment apparatus according to claim 1, wherein the phase adjustment apparatus further comprises transmission mechanisms, each of the transmission mechanisms corresponding to each of the at least two phase adjustment units to drive the each of the at least phase adjustment units to move, and the at least two phase adjustment units connected to the switching apparatus are connected to the switching apparatus through the transmission mechanisms correspondingly.

3. The phase adjustment apparatus according to claim 2, wherein a clutch that corresponds to each of the transmission mechanisms connected to the switching apparatus is disposed in the switching apparatus, the clutch comprises a driven part and a driving part capable of being separated from or engaged with each other, and a switching part; the driven part of the clutch is connected to each of the transmission mechanisms in one-to-one correspondence, the driving part is connected to the driving apparatus and corresponds to the driven part in one-to-one correspondence, the driving part is further connected to the switching part, and the switching part controls the driving part of one clutch in each of the clutches to be connected to the corresponding driven part, and the driving parts of the remaining clutches to be separated from the driven parts of the remaining clutches.

4. The phase adjustment apparatus according to claim 3, wherein the switching part comprises a sliding plate, a zigzag guide rail is disposed on the sliding plate, a sleeve ring is sleeved on the driving part, the sleeve ring penetrates the guide rail, and the sliding plate slides to enable the driving part to be engaged with or separated from the corresponding driven part.

5. The phase adjustment apparatus according to claim 4, wherein when the sliding plate moves along a longitudinal direction of the guide rail, a side wall of the guide rail forces the sleeve ring to drive the driving part to move along a direction being vertical to the longitudinal direction of the guide rail, so as to enable the driving part to be engaged with or separated from the corresponding driven part.

6. The phase adjustment apparatus according to claim 3, wherein the switching part comprises a driving member connected to the driving part of each of the clutches in one-to-one correspondence, each driving member is connected to a controller, and the controller controls each driving member to drive the driving part to be engaged with or separated from the corresponding driven part.

7. The phase adjustment apparatus according to claim 2, wherein the switching apparatus comprises a driving wheel, at least two driven wheels, and a wheel selector;
the driving wheel is connected to the driving apparatus, the at least two driven wheels are connected to the corresponding transmission mechanisms through the wheel selector, the wheel selector selects one of the at least two driven wheels to form a transmission link with the driving wheel, so as to drive the corresponding transmission mechanism to move; or
the driving wheel is connected to the driving apparatus through the wheel selector, the at least two driven wheels are connected to the corresponding transmission mechanisms, the wheel selector selects one of the at least two driven wheels to form a transmission link with the driving wheel, so as to drive the corresponding transmission mechanism to move.

8. A multi-frequency antenna, comprising:
at least two antenna units, wherein each of the at least two antenna units is connected to a phase adjustment apparatus, the phase adjustment apparatus comprises at least two phase adjustment units, a switching apparatus, and a driving apparatus, and the at least two antenna units are connected to the at least two phase adjustment units in one-to-one correspondence;
the at least two phase adjustment units are configured to modulate a phase of an electrical signal;
the driving apparatus is configured to drive the at least two phase adjustment units to move;
the at least two phase adjustment units are selectively connected to the driving apparatus; and
the switching apparatus is configured to select the at least two phase adjustment units, so that the driving apparatus drives, at a same moment, only one of the at least two phase adjustment units connected to the driving apparatus to move, so as to implement phase modulation.

9. The multi-frequency antenna according to claim 8, wherein the phase adjustment apparatus further comprises transmission mechanisms, each of the transmission mechanisms corresponding to each of the at least two phase adjustment units to drive the each of the at least phase adjustment units to move, and the at least two phase adjustment units connected to the switching apparatus are connected to the switching apparatus through the transmission mechanisms correspondingly.

10. The multi-frequency antenna according to claim 9, wherein a clutch that corresponds to each of the transmission mechanisms connected to the switching apparatus is disposed in the switching apparatus, the clutch comprises a driven part and a driving part capable of being separated from or engaged with each other, and a switching part; the driven part of the clutch is connected to each of the transmission mechanisms in one-to-one correspondence, the driving part is connected to the driving apparatus and corresponds to the driven part in one-to-one correspondence, the driving part is further connected to the switching part, and the switching part controls the driving part of one clutch in each of the clutches to be connected to the corresponding driven part, and the driving parts of the remaining clutches to be separated from the driven parts of the remaining clutches.

11. The multi-frequency antenna according to claim 10, wherein the switching part comprises a sliding plate, a cascade guide rail is disposed on the sliding plate, a sleeve ring is sleeved on the driving part, the sleeve ring penetrates the guide rail, and the sliding plate slides to enable the driving part to be engaged with or separated from the corresponding driven part.

12. The multi-frequency antenna according to claim 11, wherein when the sliding plate moves along a longitudinal direction of the guide rail, a side wall of the guide rail forces the sleeve ring to drive the driving part to move along a direction being vertical to the longitudinal direction of the guide rail, so as to enable the driving part to be engaged with or separated from the corresponding driven part.

13. The multi-frequency antenna according to claim 10, wherein the switching part comprises a driving member connected to the driving part of each of the clutches in one-to-one correspondence, each driving member is connected to a controller, and the controller controls each driving member to drive the driving part to be engaged with or separated from the corresponding driven part.

14. The multi-frequency antenna according to claim 9, wherein the switching apparatus comprises a driving wheel, at least two driven wheels, and a wheel selector;
the driving wheel is connected to the driving apparatus, the at least two driven wheels are connected to the corresponding transmission mechanisms through the wheel selector, the wheel selector selects one of the at least two driven wheels to form a transmission link with the driving wheel, so as to drive the corresponding transmission mechanism to move; or
the driving wheel is connected to the driving apparatus through the wheel selector, the at least two driven wheels are connected to the corresponding transmission mechanisms, the wheel selector selects one of the at least two driven wheels to form a transmission link with the driving wheel, so as to drive the corresponding transmission mechanism to move.

* * * * *